United States Patent

Huang et al.

[11] Patent Number: 5,881,084
[45] Date of Patent: Mar. 9, 1999

[54] SEMICONDUCTOR LASER FOR PACKAGE WITH POWER MONITORING SYSTEM

[75] Inventors: Rong-Ting Huang, Gilbert; Wenbin Jiang, Phoenix; Michael S. Lebby, Apache Junction, all of Ariz.

[73] Assignee: Motorola, Inc., Schaumburg, Ill.

[21] Appl. No.: 814,532

[22] Filed: Mar. 10, 1997

[51] Int. Cl.$^6$ ...................................................... H01S 3/18
[52] U.S. Cl. .................. 372/43; 372/43; 372/50; 257/80; 257/81; 257/82
[58] Field of Search ...................................... 32/43, 50, 96; 250/211 J; 437/209; 369/44.12, 112

[56] References Cited

U.S. PATENT DOCUMENTS

| | | | |
|---|---|---|---|
| 5,136,152 | 8/1992 | Lee | 250/211 J |
| 5,352,632 | 10/1994 | Sawaya | 437/209 |
| 5,608,695 | 3/1997 | Yamazaki | 369/44.12 |
| 5,629,919 | 5/1997 | Hayashi et al. | 369/112 |

FOREIGN PATENT DOCUMENTS

| | | | |
|---|---|---|---|
| 90-125688 | 5/1990 | Japan | 372/43 |
| 4-48672 | 2/1992 | Japan | 372/43 |

*Primary Examiner*—Rodney Bovernick
*Assistant Examiner*—Yisun Song
*Attorney, Agent, or Firm*—Eugene A. Parsons; William E. Koch

[57] ABSTRACT

A semiconductor laser package and method of fabrication including a vertical cavity surface emitting laser and a power monitoring system, such as a photodetector mounted on a mounting base. An optical element, such as a beam splitter, formed integral with the mounting base or as a separate element positioned on the mounting base in optical alignment with an emission generated by the vertical cavity surface emitting laser. The optical element characterized by reflecting a portion of the emission in the direction of the photodetector and allowing a portion of the emission to pass therethrough. An overmolded housing is positioned on the mounting base to enclose the vertical cavity surface emitting laser, the photodetector and the optical element.

18 Claims, 3 Drawing Sheets

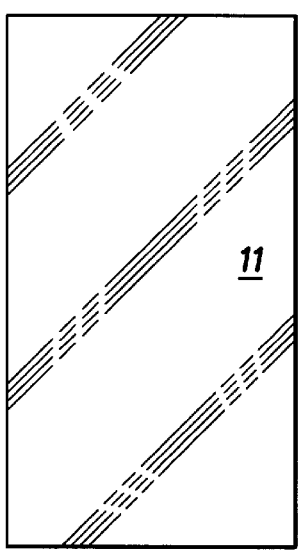
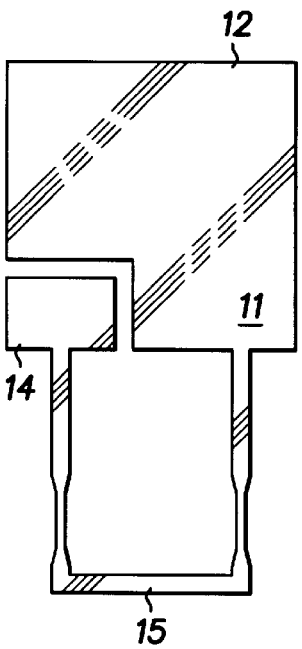
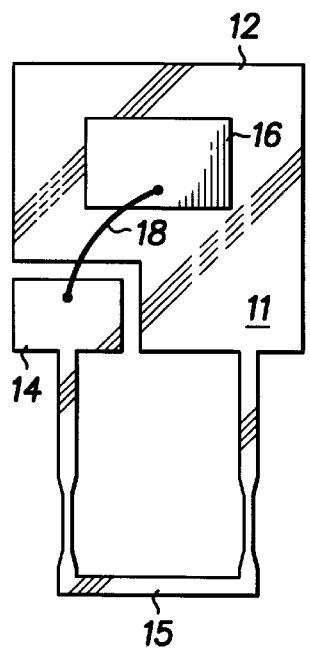
FIG. 1  FIG. 2  FIG. 3
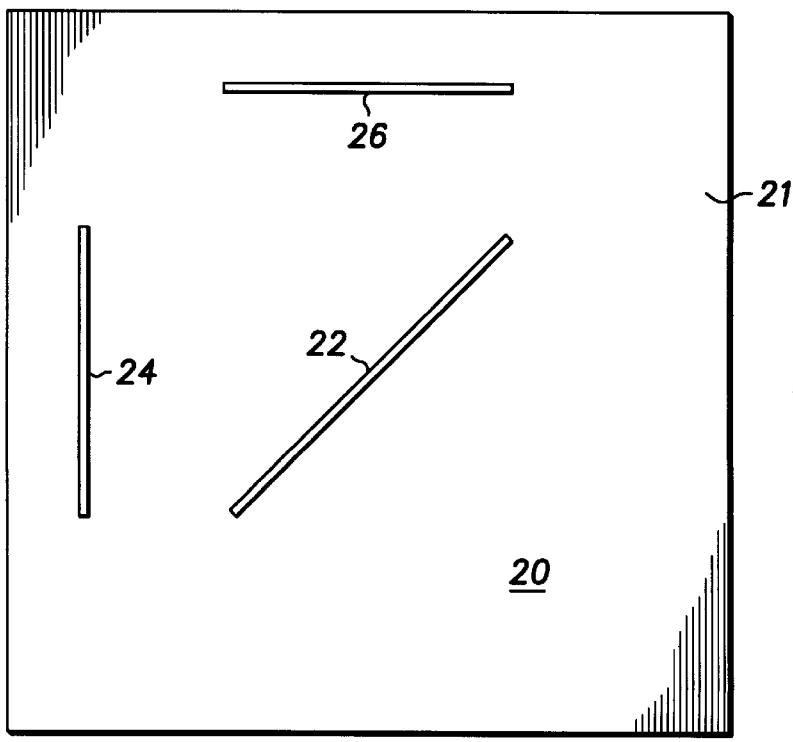
FIG. 4

SEMICONDUCTOR LASER FOR PACKAGE WITH POWER MONITORING SYSTEM

FIELD OF THE INVENTION

The present invention pertains to semiconductor lasers and more specifically to the packaging of semiconductor lasers and method of fabrication.

BACKGROUND OF THE INVENTION

Since the development of laser diodes, many applications for their use have been developed. Increasingly, laser diodes are employed for communications and are integral to optical disc recording and storage systems. Typically, edge emitting diode lasers are used. Edge emitting diode lasers, however, have a high cost in parallel and serial data links, and have a high current drain due to a high threshold current when used in compact disc pickups.

New systems are being developed to employ vertical cavity surface emitting lasers (VCSELs) in place of edge emitting lasers. The VCSELs provide a much lower cost, use surface emissions which simplify optical devices and are capable of being fabricated in larger volumes on semiconductor wafers. However, a problem exist in the packaging of such VCSELs, namely the cost of materials employed in the typical "can" type packages. The conventional semiconductor laser apparatus utilizes a metal TO can for packaging, and includes the formation of a "window" within a cap portion of the can through which the laser emission passes. In that metal is utilized in which a "window" must be formed, the cost of materials impacts the yield. Therefore, there exist a need for packaging of vertical cavity surface emitting lasers that would reduce the cost of manufacture.

In addition, there is a need to incorporate into the package a monitoring system which will automatically control the emissions emitted by the VCSEL. Generally, edge emitting laser diodes employ a power monitoring detector facing the back emission facet of the device. In a VCSEL with a wavelength shorter than 870 nm, there is no back emission due to the opaque substrate on which the device is necessarily formed.

Thus there is a need for a lower cost semiconductor laser package that has included therein a power monitoring system, thus allowing automatic power control (APC) of the VCSEL emission.

Accordingly, it is highly desirable and an object of this invention to provide for a low cost semiconductor laser package and method of fabrication that allows for monitoring of the VCSEL emission.

It is another purpose of the present invention to provide for a new and improved semiconductor laser package that is inexpensive, easily fabricated and allows for automatic power control of the VCSEL emission.

It is a still further purpose of the present invention to provide for a new and improved semiconductor laser package that is fabricated to include an optical element, such as a beam splitter, positioned to split a laser emission incident thereon, resulting in a small portion of the laser emission being reflected toward a power monitor and allowing a portion of the laser emission to pass therethrough.

SUMMARY OF THE INVENTION

The above problems and others are substantially solved and the above purposes and others are realized in a semiconductor laser package including a vertical cavity surface emitting laser generating an emission along a path, a molded base having a molded beam splitter, a power monitoring system positioned to receive an emission reflected by the beam splitter, and a plastic resin housing for encapsulating the vertical cavity surface emitting laser and the monitoring system. The beam splitter element is either formed as a portion of the molded base and in the path of emission or formed as a separate element and positioned in the path of emission, thereby reflecting a portion of the emission. A monitoring system, such as a photodetector, is optically positioned, formed as a separate device, to receive the reflected portion of the emission.

A method of fabricating the semiconductor laser package of the present invention includes the steps of providing a first metal plate and a second metal plate and stamping each of the first metal plate and the second metal plate to form a first major portion, a second major portion and an electrical lead. There is positioned on the first metal plate a vertical cavity surface emitting laser generating an emission along a path and positioned on the second metal plate a photodetector to receive a portion of the emission. There is provided a mounting base having formed therein a first opening and a second opening and an optical element. The first metal plate is positioned within the first opening and the second metal plate is positioned within the second opening, thereby optically aligning the vertical cavity surface emitting laser and the optical element. An overmolded housing is formed about the first metal plate, the second metal plate and the optical element.

BRIEF DESCRIPTION OF THE DRAWINGS

The novel features believed characteristic of the invention are set forth in the claims. The invention itself, however, as well as other features and advantages thereof will be best understood by reference to detailed descriptions which follow, when read in conjunction with the accompanying drawings, wherein:

FIG. 1 is a top plan view of a metal plate utilized in the fabrication of a VCSEL with power monitoring system of the present invention;

FIG. 2 is a top plan view of the metal plate of FIG. 1 after having undergone stamping to a desired shape;

FIG. 3 is a top plan view of a vertical cavity surface emitting laser positioned on and wired bonded to the stamped metal plate;

FIG. 4 is top plan view of a mounting base utilized in the vertical cavity surface emitting laser with power monitor of the present invention;

DETAILED DESCRIPTION OF THE PREFERRED EMBODIMENT

Figure 5:
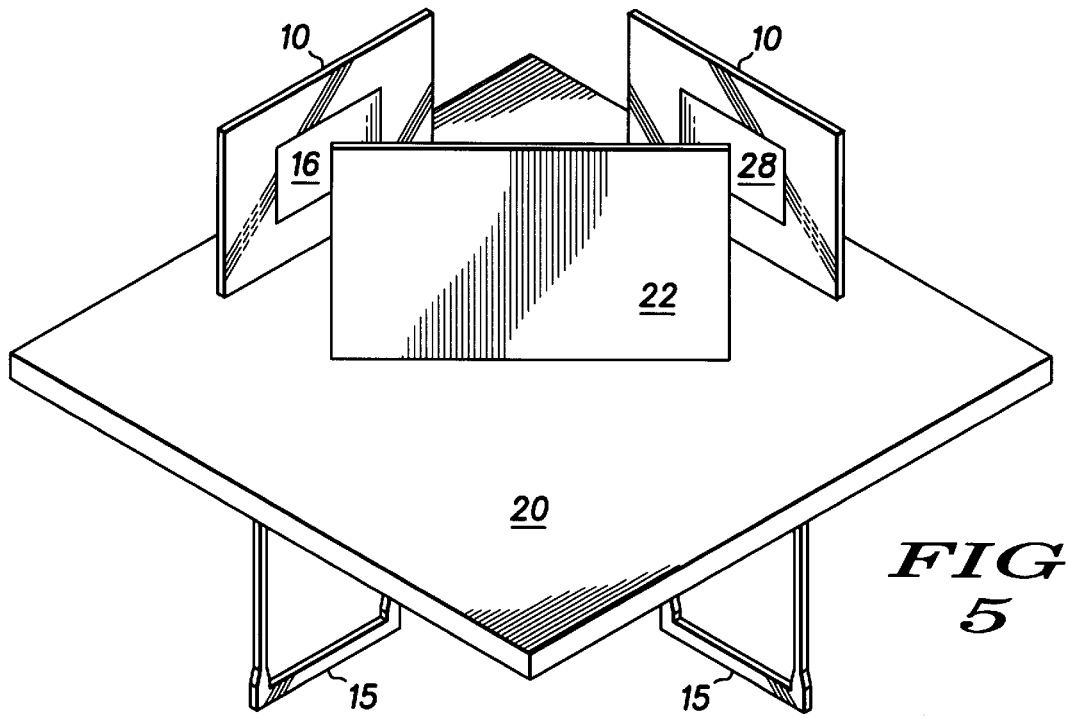
FIG. 5 is a simplified isometric view of a mounting base having positioned thereon a vertical cavity surface emitting laser and power monitor in accordance with the present invention.

Turning now to the drawings in which like reference characters indicate corresponding elements throughout the several views, attention is first directed to FIGS. 1–3 which illustrate the formation of a metal plate having positioned thereon a vertical cavity surface emitting laser (VCSEL) or a power monitoring system, such as a photodetector. More specifically, illustrated in FIG. 1 is a top plan view of a metal plate 10 which is utilized in the present invention. Metal plate 10 is disclosed as formed of a metal, such as iron (Fe), aluminum (Al), or the like, having a nickel (Ni), gold (Au), or similar coating on a surface 11. In addition, it is disclosed to form metal plate 10 of solid nickel (Ni), so as to eliminate the need for a separate nickel (Ni) coating. In this particular embodiment, metal plate 10 is formed of iron (Fe) having a nickel (Ni) coating on surface 11. Metal plate 10 is approximately 0.01–2 mm thick, having a nickel (Ni) coating that is approximately 0.01–100 microns thick. A nickel (Ni) coating is utilized due to its thermal properties and its allowance for gold (Au) or aluminum (Al) wire bonding.

Referring now to FIG. 2, illustrated in top plan view is metal plate 10, having undergone a stamping process so as to form a first major portion 12, a second major portion 14 and electrical leads 15. As illustrated in FIG. 3, a standard vertical cavity surface emitting laser 16, well known in the art, is mounted to surface 11 of first major portion 12. It should be understood throughout the description that the specific VCSEL illustrated is intended to be a ridge VCSEL, utilized for purposes of this disclosure only and it should be understood that any of a wide variety of different types of VCSELs including ridge, planar, those etched through to the structure, etc. can be utilized for VCSEL 16 of the present invention.

Briefly, the VCSEL 16 of FIGS. 1–7, is fabricated on any suitable semiconductor substrate, such as gallium arsenide, indium phosphide, or the like where the semiconductor substrate provides a surface. A first stack of distributed Bragg reflectors, an active region, and a second stack of distributed Bragg reflectors are epitaxially deposited on the surface by any suitable method, such as molecular beam epitaxy (MBE), meto-organic chemical vapor deposition (MOCVD), or the like. The first stack of distributed Bragg reflectors includes a plurality of layers of a semiconductor material with alternating indexes of refraction. The active region is grown on the upper surface of first stack of the distributed Bragg reflectors, which includes one or more quantum wells separated by barrier layers with a spacer and/or cladding layer on either side thereof. The quantum wells and spacer layers are also grown epitaxially. The second stack of distributed Bragg reflectors is formed on the upper surface of the active region by, for example, epitaxially growing pairs of semiconductor layers as described in conjunction with the first stack. The first and second stacks are doped with opposite conductivity types to form a two terminal (diode) structure for the flow of electrical current therethrough. An electrical contact is positioned over the lower surface of the substrate. With the epitaxial depositions being complete, the second stack of distributed Bragg reflectors is patterned to form a ridge. Generally, VCSEL 16 is made by any suitable well known method in the art, such as photolithography, etching, lift-off, any combination thereof, or the like. By defining a ridge in the second stack of distributed Bragg reflectors, an optical path is defined in the second stack of distributed Bragg reflectors that reflects and guides light formed in the active region. A complete disclosure of the construction of ridge VCSELs is available in U.S. Pat. No. 5,256,596 entitled "TOP EMITTING VCSEL WITH IMPLANT", issued Oct. 26, 1993, assigned to the same assignee and incorporated herein by this reference.

Referring more specifically to FIG. 3, once the epitaxial depositions are complete, and the VCSEL 16 has been formed, it is positioned on metal plate 10. A wire bond 18 electrically interfaces VCSEL 16 with second major portion 14. It should be understood that second major portion 14 in the final project will serve as the electrical interface plate to VCSEL 16.

Similarly, a power monitoring system is formed by positioning a power monitoring device, such as a photodetector, on a separate metal plate 10 from that on which VCSEL 16 is positioned. The photodetector (illustrated as reference number 28 in FIG. 5, discussed presently) is formed as a separate device, positioned on metal plate 10 to receive a portion of the emissions reflected from an optical element (discussed presently) positioned in the emission path of VCSEL 16. The optical element permits the majority of the emissions to pass through for further use, while reflecting a small percentage back to the photodetector. Again, the specific photodetector illustrated throughout this disclosure is utilized for purposes of this explanation only and may be any convenient photo sensitive device, such as a commercially available silicon (Si) PIN detector.

The disclosed embodiment of the photodetector acts as monitoring devices to monitor the emissions from VCSEL 16. As previously stated, this is accomplished by positioning the photodetector to receive and monitor a portion of the emissions reflected from an optical element (discussed presently).

In the preferred embodiment, the VCSEL device and monitoring system includes a package fabricated so as to completely enclose and protect VCSEL 16 and the photodetector of the present invention. Referring now to FIG. 4, illustrated in top plan view is a mounting base 20 in accordance with the present invention. In the preferred embodiment mounting base 20 is formed of a molded plastic resin, which in this particular embodiment is opaque, thereby preventing external background light from entering the monitoring photodetector. There is positioned or formed on an uppermost surface 21 of mounting base 20 an optical element 22, more particularly a beam splitter. In a preferred embodiment, optical element 22 is integrally molded with mounting base 20 at the time of formation. Alternatively, optical element 22 is fabricated as a separate device and positioned relative to mounting base 20 in a path of laser emission from VCSEL 16. A first opening 24 is formed in mounting base 20 which provides a space for metal plate 10, having positioned thereon VCSEL 16, to be inserted. A second opening 26 is formed in mounting base 20 and provides a space for metal plate 10, having positioned thereon a power monitoring system, to be inserted. It should be understood that first opening 24 and second opening 26 are formed having close tolerances to metal plates 10, thus providing for a mechanically robust device.

Referring now to FIG. 5, illustrated in simplified isometric view is mounting base 20 having positioned and mounted thereto VCSEL 16 and a power monitoring system, such as a photodetector 28. During fabrication mounting structure 20, optical element 22, VCSEL 16 and photodetector 28 can be molded and/or positioned by automated robotic steps, thereby reducing the cost of manufacture of the semiconductor device. More specifically, metal plate 10 having VCSEL 16 formed thereon is inserted into first opening 24. Metal plate 10 having photodetector 28 formed thereon is inserted into second opening 26.

Figure 6:
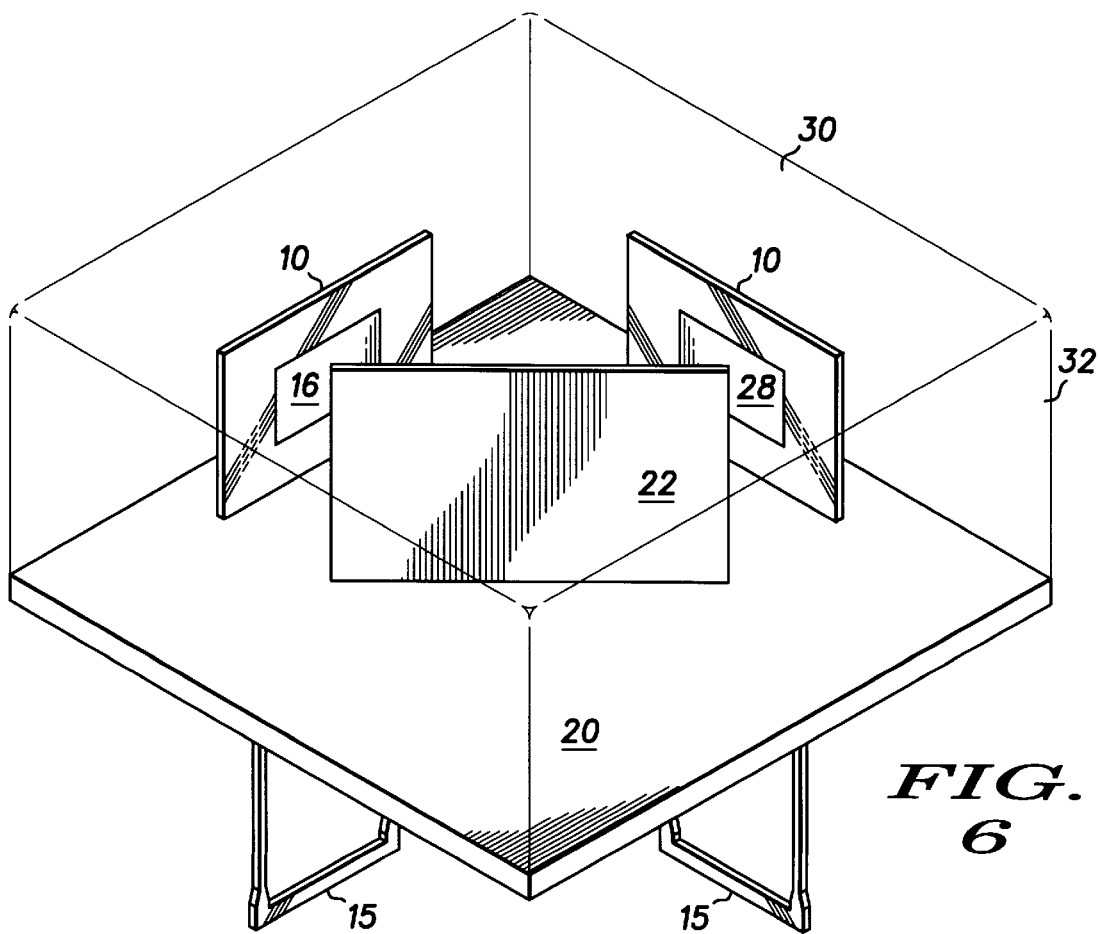
FIG. 6 is a simplified isometric view of a plastic resin package housing a vertical cavity surface emitting laser and a power monitor in accordance with the present invention.

Referring now to FIG. 6, an overmold housing 30 is next positioned or formed about metal plate 10/VCSEL 16, metal plate 10/photodetector 28, and optical element 22. Overmolded housing 30 is composed of an optically transparent material, such as an optically transparent plastic resin. Overmolded housing 30 is fabricated having a coefficient of thermal expansion (CTE) in a range of 10–30 ppm with a preferred CTE of 20 ppm or less. In this particular embodiment, housing 30 is formed having substantially planar sides. It should be understood that various other formations are possible, although it is necessary that a side 32 through which the laser emission passes (discussed presently) should be formed substantially perpendicular to the emission path of VCSEL 16. In addition, side 32 is alternatively formed having optical properties integrally molded therein or stamped thereon during the fabrication of housing 30.

It should be understood that in the disclosed preferred embodiment of the semiconductor package of the present invention, that the housing, is formed of an optically transparent material. Alternatively, housing 30 can be formed of a substantially opaque molded plastic resin, with a transparent portion formed on side 32, thereby permitting the laser emission to pass therethrough and preventing external background light from entering the package and thus interfering with the monitoring device. In addition, as previously stated it should be understood that the mounting base 20 and optical element 22 as disclosed, can be molded as one integral piece as illustrated in the figures, or molded as separate pieces, thereafter optical element 22 being positioned on mounting base 20 so as to deflect a portion of the laser emission.

Due to the low power operation of vertical cavity surface emitting lasers in general, thermal dissipation of such a plastic package should not be a problem. Accordingly, the coefficient of thermal expansion (CTE) of housing 30 is similar to the coefficient of thermal expansion of VCSEL 16. Alternatively, a underfill material can be positioned about VCSEL 16 prior to overmolding of housing 30, thereby providing a buffer about VCSEL 16.

Figure 7:
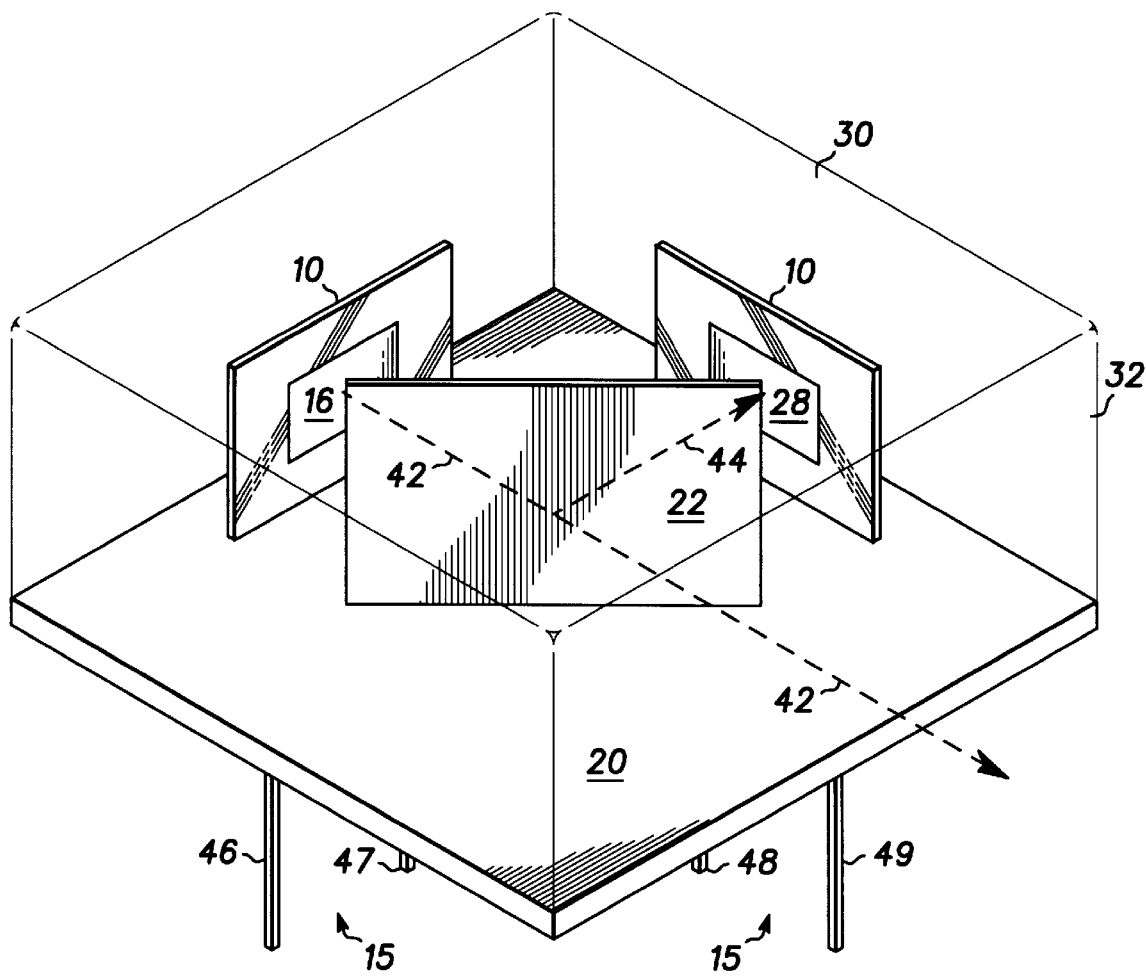
FIG. 7 is a simplified isometric view of the complete semiconductor package including a vertical cavity surface emitting laser with power monitor system in accordance with the present invention.

Illustrated in FIG. 7 in simplified isometric view is a complete semiconductor package 40 including a VCSEL device with a power monitoring system. Illustrated are metal plate 10 having formed thereon VCSEL 16 and separate metal plate 10 having formed thereon photodetector 28. Metal plates 10 are positioned into first opening 24 and second opening 26 so as to allow for electrical leads 15 to protrude therefrom an underneath side. Housing 30 is overmolded over metal plate 10/VCSEL 16, metal plate 10/photodetector 28, and optical element 22. Next, electrical leads 15 are cut to electrically separate electrical leads 15, forming a cathode and an anode for VCSEL 16 and photodetector 28. More particularly, electrical leads 15 extending from metal plate 10 onto which VCSEL 16 is formed are cut forming a first electrical lead 46 and a second electrical lead 47. Electrical leads 15 extending from metal plate 10 onto which photodetector 28 is formed are cut forming a first electrical lead 48 and a second electrical lead 49.

During operation, a laser emission 42 emitted by VCSEL 16 passes through optical element 22. A portion of laser emission 42 is reflected by optical element 22, illustrated as laser path 44, and is monitored by photodetector 28. The portion of laser emission 42 which passes through optical element 22, exits housing 30 through side 32. Monitoring the laser power of a VCSEL 16 is controlled by employing a feedback system. A control device receives and processes the information monitored by a photodetector 28. More specifically, the laser power output based upon the specific laser power detected by monitoring the reflected laser emission of VCSEL 16. This processing of the information monitored by photodetector 28 allows for the identification of a point at which a change in laser power is detected, thereby providing for automatic regulation of the current employed to drive VCSEL 16 from a current source. Thus, knowledge of the laser power at which the laser light is emitted, allows for automatic power control (APC) based on feedback, thereby maintaining operation of the laser at a specific, constant laser power output. It should be understood that housing 30 is fabricated of a material having a different refractive index than optical element 22. In the preferred embodiment, the refractive index of optical element 22 is higher than the refractive index of housing 30. This difference in refractive index, allows for the reflection of a portion of laser emission 42 determined by the relative percentage, as illustrated by directional arrow 44, toward photodetector 28.

Thus, a semiconductor laser package with power monitoring system is disclosed. More specifically, a molded plastic resin housing, positioned on a mounting base, having formed therein a plurality of openings for positioning therethrough a metal plate having a VCSEL positioned thereon and a metal plate having a photodetector positioned thereon. The openings allow for metal leads to protrude therethrough the mounting base. More specifically, there is provided housed within the package a vertical cavity surface emitting laser having provided as a separate, a photodetector. An optical element is positioned on or formed integral with the mounting base. The optical element is positioned within the emission path of the vertical cavity surface emitting laser, thereby serving to permit a substantial portion of the laser emission to pass therethrough while reflecting toward the photodetector a small percentage for monitoring by the photodetector. The device is fabricated in a minimal number of simple steps which can be accomplished by an automated process, thereby increasing yield by reducing the cost of the finished product.

While we have shown and described specific embodiments of the present invention, further modifications and improvement will occur to those skilled in the art. We desire it to be understood, therefore, that this invention is not limited to the particular forms shown and we intend in the appended claims to cover all modifications that do not depart from the spirit and scope of this invention.

What is claimed is:

1. A semiconductor laser package comprising:
   a mounting base including a first opening and a second opening;
   a vertical cavity surface emitting laser positioned in the first opening of the mounting base, the vertical cavity surface emitting laser generating an emission along a path;
   an optical element positioned relative to the vertical cavity surface emitting laser, the optical element characterized by reflecting a portion of the emission generated by the vertical cavity surface emitting laser;
   a power monitoring system positioned in the second opening of the mounting base, the power monitoring system optically positioned to receive the portion of the emission reflected by the optical element; and
   a housing for encapsulating the vertical cavity surface emitting laser, the optical element and the power monitoring system.

2. A semiconductor laser package according to claim 1 wherein the optical element positioned in the path and reflecting a portion of the emission is a beam splitter.

3. A semiconductor laser package according to claim 2 wherein the optical element is integrally molded with the mounting base.

4. A semiconductor laser package according to claim 2 wherein the optical element is fabricated as a separate element and affixed to an uppermost surface of the mounting base.

5. A semiconductor laser package according to claim 2 wherein the power monitoring system is a photodetector.

6. A semiconductor laser package according to claim 1 wherein the housing is formed of an overmolded plastic resin.

7. A semiconductor laser package according to claim 6 wherein the plastic resin housing includes at least one side that is optically transparent and in the path of emission.

8. A semiconductor laser package comprising:

a molded base;

a vertical cavity surface emitting laser generating an emission along a path, the vertical cavity surface emitting laser fabricated on a metal plate, the metal plate being mounted to a surface of the molded base;

an optical element positioned in the path of the emission and reflecting a portion of the emission;

a photodetector optically positioned to receive the reflected portion of the emission, the photodetector fabricated on a metal plate, the metal plate being mounted to a surface of the molded base;

a molded housing for encapsulating the vertical cavity surface emitting laser, the optical element and the photodetector.

9. A semiconductor laser package according to claim 8 wherein the optical element is a beam splitter, thereby allowing for a portion of the laser emission to pass therethrough and reflecting a portion of the emission.

10. A semiconductor laser package according to claim 8 further including an underfill material positioned about the vertical cavity surface emitting laser and the photodetector, whereby the underfill material, the vertical cavity surface emitting laser and the photodetector have similar coefficients of thermal expansion.

11. A semiconductor laser package according to claim 8 wherein the vertical cavity surface emitting laser is fabricated as a ridge vertical cavity surface emitting laser.

12. A semiconductor laser package according to claim 8 wherein the photodetector is a silicon (Si) PIN photodetector.

13. A semiconductor laser package according to claim 8 wherein the vertical cavity surface emitting laser and the photodetector are positioned laterally spaced apart.

14. A semiconductor laser package comprising:

a vertical cavity surface emitting laser generating an emission along a path, the vertical cavity surface emitting laser fabricated on a first metal plate, the first metal plate mounted to a mounting base;

a beam splitter positioned in the path of emission and reflecting a portion of the emission;

a photodetector fabricated on a second metal plate, the second metal plate mounted to the mounting base, thereby optically positioning the photodetector to receive a reflected portion of the emission; and a molded housing for encapsulating the vertical cavity surface emitting laser, the beam splitter and the photodetector, the molded housing mounted to the mounting base.

15. A semiconductor laser package according to claim 14 wherein the molded housing is molded as a one-piece overmolded unit having a transparent portion through which the emission passes.

16. A semiconductor laser package according to claim 15 wherein the transparent portion of the molded housing has formed therein at least one optical property.

17. A semiconductor laser package according to claim 15 wherein the transparent portion of the molded housing has formed thereon at least one optical property.

18. A semiconductor laser package according to claim 14 wherein the mounting base is further characterized as having formed therein a first opening and a second opening, the first opening and the second opening allowing for positioning therethrough the first metal plate and the second metal plate.

* * * * *